(12) United States Patent
Miller et al.

(10) Patent No.: US 6,643,557 B1
(45) Date of Patent: Nov. 4, 2003

(54) METHOD AND APPARATUS FOR USING SCATTEROMETRY TO PERFORM FEEDBACK AND FEED-FORWARD CONTROL

(75) Inventors: Michael L. Miller, Cedar Park, TX (US); Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 721 days.

(21) Appl. No.: 09/591,038

(22) Filed: Jun. 9, 2000

(51) Int. Cl.[7] ............................................... G06F 19/00
(52) U.S. Cl. ..................... 700/110; 702/84; 700/121
(58) Field of Search ................................ 700/110, 121, 700/108; 702/84, 179

(56) References Cited

U.S. PATENT DOCUMENTS

| | | | |
|---|---|---|---|
| 5,511,005 A | 4/1996 | Abbe et al. ............... 702/84 |
| 5,629,772 A | 5/1997 | Ausschnitt ............... 356/625 |
| 5,719,495 A | 2/1998 | Moslehi ................... 324/158.1 |
| 5,900,633 A | 5/1999 | Solomon et al. ........ 250/339.08 |
| 5,987,398 A | * 11/1999 | Halverson et al. ........ 702/179 |
| 6,016,562 A | * 1/2000 | Miyazaki et al. ........ 714/724 |
| 6,051,348 A | 4/2000 | Marinaro et al. ........ 430/30 |
| 6,051,349 A | 4/2000 | Yoshioka et al. ........ 430/30 |
| 6,245,584 B1 | 6/2001 | Marinaro et al. ........ 438/14 |
| 6,304,999 B1 | * 10/2001 | Toprac et al. ........... 716/4 |
| 6,314,379 B1 | * 11/2001 | Hu et al. ................. 702/81 |
| 6,433,878 B1 | 8/2002 | Niu et al. ................ 356/603 |
| 6,597,447 B1 | * 7/2003 | Stirton et al. ........... 356/237.2 |
| 2002/0135781 A1 | 9/2002 | Singh et al. ............. 356/601 |

FOREIGN PATENT DOCUMENTS

EP 0973068 1/2000 ............. G03F/7/20

OTHER PUBLICATIONS

International Search Report dated May 27, 2002 for International application No. PCT/US01/15124 Filed May 9, 2001.

* cited by examiner

*Primary Examiner*—Leo Picard
*Assistant Examiner*—Sheela S. Rao
(74) *Attorney, Agent, or Firm*—Williams, Morgan, & Amerson, P.C.

(57) ABSTRACT

The present invention provides for a method and an apparatus for using scatterometry to perform feedback and feed-forward control. A processing run of semiconductor devices is performed. Metrology data from the processed semiconductor devices is acquired. Error data is acquired by analyzing the acquired metrology data. A determination is made whether the error data merits modification to the processing of semiconductor devices. A feedback modification of the processing of semiconductor devices is performed in response to the determination that the error data merits modification to the processing of semiconductor devices. A feed-forward modification of the processing of the semiconductor devices is performed in response to the determination that the error data merits modification to the processing of semiconductor devices.

29 Claims, 5 Drawing Sheets

METHOD AND APPARATUS FOR USING SCATTEROMETRY TO PERFORM FEEDBACK AND FEED-FORWARD CONTROL

BACKGROUND OF THE INVENTION

1. Field of the Invention

This invention relates generally to semiconductor manufacturing, and, more particularly, to a method and apparatus for automated error correction for wafer-by-wafer processing.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and, therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are wafer-to-wafer variations that are caused by manufacturing problems that include start-up effects of manufacturing machine tools, memory effects of manufacturing chambers, and first-wafer effects. One of the process steps that is adversely affected by such factors is the photolithography process. Overlay is one of several important steps in semiconductor manufacturing. Line-widths, or critical dimensions, are important measurements that relate to the quality of the photolithography process. Line-width control in semiconductor manufacturing involves measuring the characteristic dimension of lines/spaces patterned onto the semiconductor wafer that is being processed. Generally, minimization of the deviation of the patterned line-width to the targeted line-width is important to ensure that the multiple layers of the semiconductor devices are connected and functional. As technology facilitates smaller critical dimensions for semiconductor devices, the need for fewer off-target line-widths increases dramatically.

Generally, photolithography engineers currently measure the line-width once per lot immediately following the photolithography (or subsequent etch) process. The measured line-width errors can be used to make manual or automatic updates to exposure tool settings. Some of the problems associated with the current methods include the fact that the exposure tool settings can generally only be updated once per lot.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes increases, improved methods are needed to revise input parameters that control manufacturing processes in a more automated and timely manner. Furthermore, wafer-to-wafer manufacturing variations can cause non-uniform quality of semiconductor devices.

A known technique for evaluating the acceptability of the photolithography process involves measuring critical dimensions or other parameters after the photoresist has been developed. One method used to evaluate the developed wafer is to use scatterometry to generate an intensity measurement indicative of the pattern on the wafer. The pattern in the developed photoresist appears as a series of trenches. Light is reflected differently in the trenched versus the non-trenched areas, resulting in a characteristic scattering pattern. The scatterometry measurements may be used to change the photoresist operating parameters, such as exposure time, post exposure bake time, develop time, etc., to affect the pattern formed on subsequent wafers. A limitation of post-develop measurement techniques (such as Scanning Electron Microscopy [SEM]) is that significant time elapses between the measurement and the corrective action, potentially resulting in numerous unusable wafers. Furthermore, due to the measurement time that is required when using these techniques, only a small fraction of each manufacturing lot of semiconductor wafers can be measured. The industry today lacks an efficient manner of utilizing scatterometry techniques to reduce variabilities in processed semiconductor wafers.

The present invention is directed to overcoming, or at least reducing the effects of, one or more of the problems set forth above.

SUMMARY OF THE INVENTION

In one aspect of the present invention, a method is provided for using scatterometry to perform feedback and feed-forward control. A processing run of semiconductor devices is performed. Metrology data from the processed semiconductor devices is acquired. Error data is acquired by analyzing the acquired metrology data. A determination is made whether the error data merits modification to the processing of semiconductor devices. A feedback modification of the processing of semiconductor devices is performed in response to the determination that the error data merits modification to the processing of semiconductor devices. A feed-forward modification of the processing of the semiconductor devices is performed in response to the determination that the error data merits modification to the processing of semiconductor devices.

In another aspect of the present invention, an apparatus is provided for using scatterometry to perform feedback and feed-forward control. The apparatus of the present invention comprises: a computer system; a manufacturing model coupled with the computer system, the manufacturing model being capable of generating and modifying at least one control input parameter signal; a machine interface coupled with the manufacturing model, the machine interface being capable of receiving process recipes from the manufacturing model; a processing tool capable of processing semiconductor wafers and coupled with the machine interface, the first processing tool being capable of receiving at least one control input parameter signal from the machine interface; a metrology tool coupled with the first processing tool and the second processing tool, the metrology tool being capable of acquiring metrology data; a metrology data processing unit coupled with the metrology tool, the metrology data processing unit being capable of organizing the acquired metrology data; a feedback/feed-forward controller coupled with the metrology tool and the computer system, wherein the feedback/feed-forward controller is capable of generating feedback and feed-forward adjustment data and sending them to the computer system for modification of the control system parameters.

BRIEF DESCRIPTION OF THE DRAWINGS

The invention may be understood by reference to the following description taken in conjunction with the accompanying drawings, in which like reference numerals identify like elements, and in which.

Figure 1:
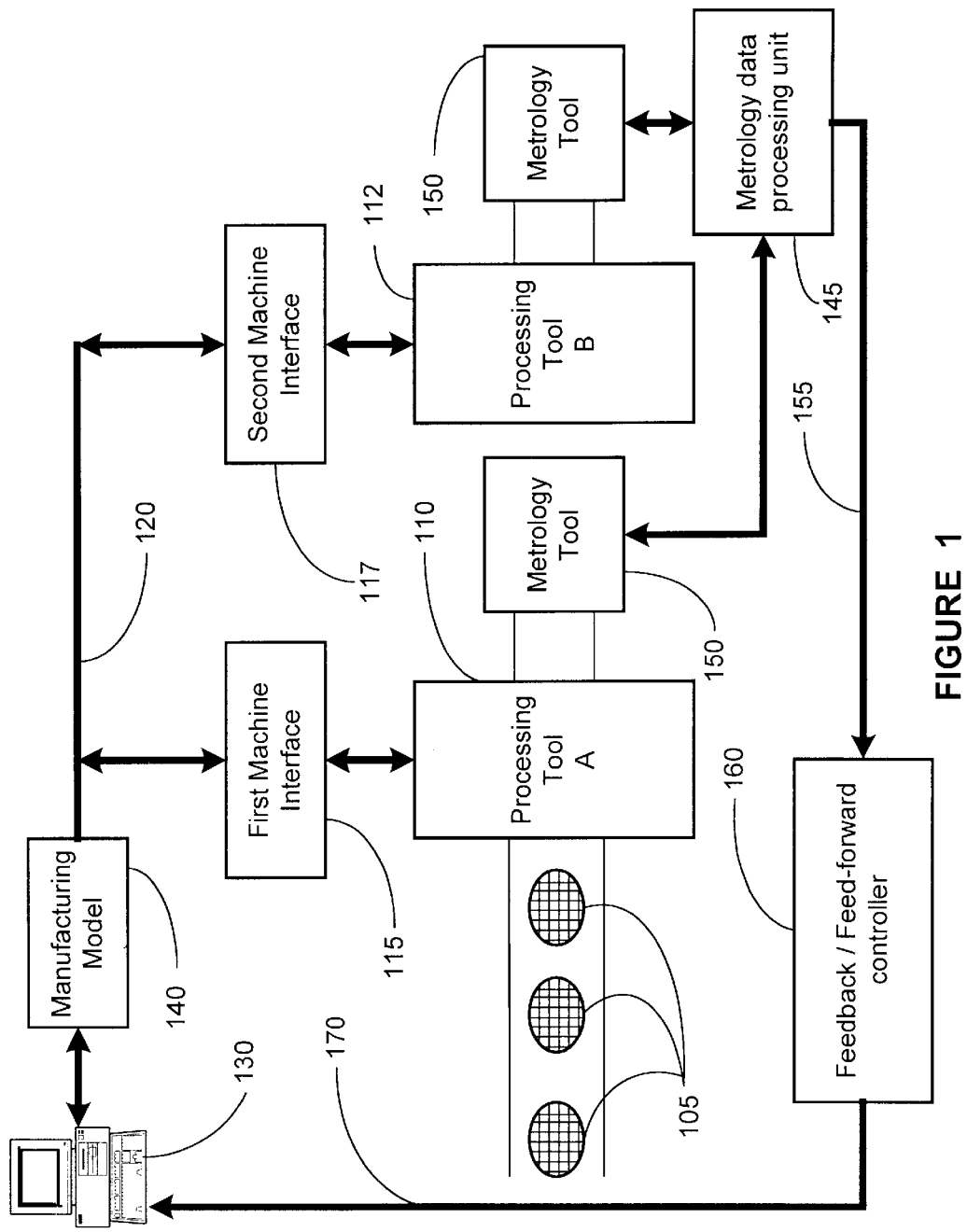
FIG. 1 illustrates one embodiment of the method taught by the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Wafer-to-wafer variations can result in an output of non-uniform semiconductor devices. One process that is affected is the photolithography overlay process. Overlay process is an important step in semiconductor manufacturing. In particular, overlay process involves measuring misalignment errors between semiconductor layers during manufacturing processes. Improvements in the overlay process could result in substantial enhancements, in terms of quality and efficiency, in semiconductor manufacturing processes. The present invention provides a method of implementing automated error correction for wafer-to-wafer variations.

Semiconductor devices are processed in a manufacturing environment using a number of input control parameters. Turning now to FIG. 1, one embodiment of the present invention is illustrated. In one embodiment, semiconductor products 105, such as semiconductor wafers, are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model 140 contains a recipe that determines a plurality of control input parameters that are sent on the line 120.

In one embodiment, the manufacturing model 140 defines a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers, scanners, step-and-scan tools, and etch process tools. In one embodiment, processing tool A 110 is a photolithography tool, such as a stepper, and processing tool B 112 is an etch process tool.

One or more of the semiconductor wafers that are processed by the processing tools 110, 112 are generally sent to a metrology tool 150 for acquisition of metrology data. In one embodiment, the metrology tool 150 is a scatterometry data acquisition tool, or a scatterometer. Data from the metrology tool 150 is processed and organized by the metrology data processing unit 145. In one embodiment, the metrology data processing unit 145 correlates the metrology data to a particular manufacturing lot of processed semiconductor wafers. In one embodiment, the metrology data processing unit 145 is integrated into the computer system 130. In one embodiment, the metrology data processing unit 145 is a computer software program embedded into the computer system 130, wherein the computer system 130 is integrated within an APC framework.

The processed metrology data, which in one embodiment is scatterometry data, from the metrology data processing unit 145 is sent to a feedback/feed-forward controller 160 on a line 155. In one embodiment, the feedback/feed-forward controller 160 processes the scatterometry data and generates feedback and feed-forward adjustment data that are known by those skilled in the art. The feedback and feed-forward adjustment data, described below, is sent to the computer system 130 via a line 170. The computer system 130 utilizes the feedback and feed-forward adjustment data to make modifications in the manufacturing model 140, which causes appropriate changes in the control input parameters on the line 120. In one embodiment, the feedback/feed-forward controller 160 is integrated into the computer system 130. In one embodiment, the feedback/feed-forward controller 160 is a computer software program embedded into the computer system 130.

Among the bases for modifying the control input signal on the line 120 are metrology measurements performed on processed semiconductor wafers, such as scatterometry measurements. The metrology measurements are used to perform a feedback modification and a feed-forward modification of the control input signals. Generally, the feedback modification of the control input signals on the line 120 are performed on photolithography processes, such as line-width adjustments using photo exposure dosages and line profile adjustments using exposure focus modifications. Feedback modification of the control input signal on the line 120 can also be performed on etch processes, such as etch line shape adjustments using etch recipe modifications.

Feed-forward modification of the control input signals on the line 120 can be used to perform corrections of subsequent processes on the semiconductor wafers. Feed-forward modification of the control input signals on the line 120 can be used in etch or spacer deposition processes, where scatterometry techniques can be used to adjust effective line-widths of precision forms on semiconductor wafers. In one embodiment, in a spacer deposition process, scatterometry measurements can be used to adjust deposition time, which may impact the spacer width, which in turn would impact the effective line-width of a trace on a semiconductor wafer.

In the context of a manufacturing process such as a stepper process, the control inputs on the line 120 that are used to operate the processing tool 110 include an exposure dose signal. One of the primary features taught by the present invention is a method of updating control input signals on the line 120 in response to an analysis of external variables.

Figure 2:
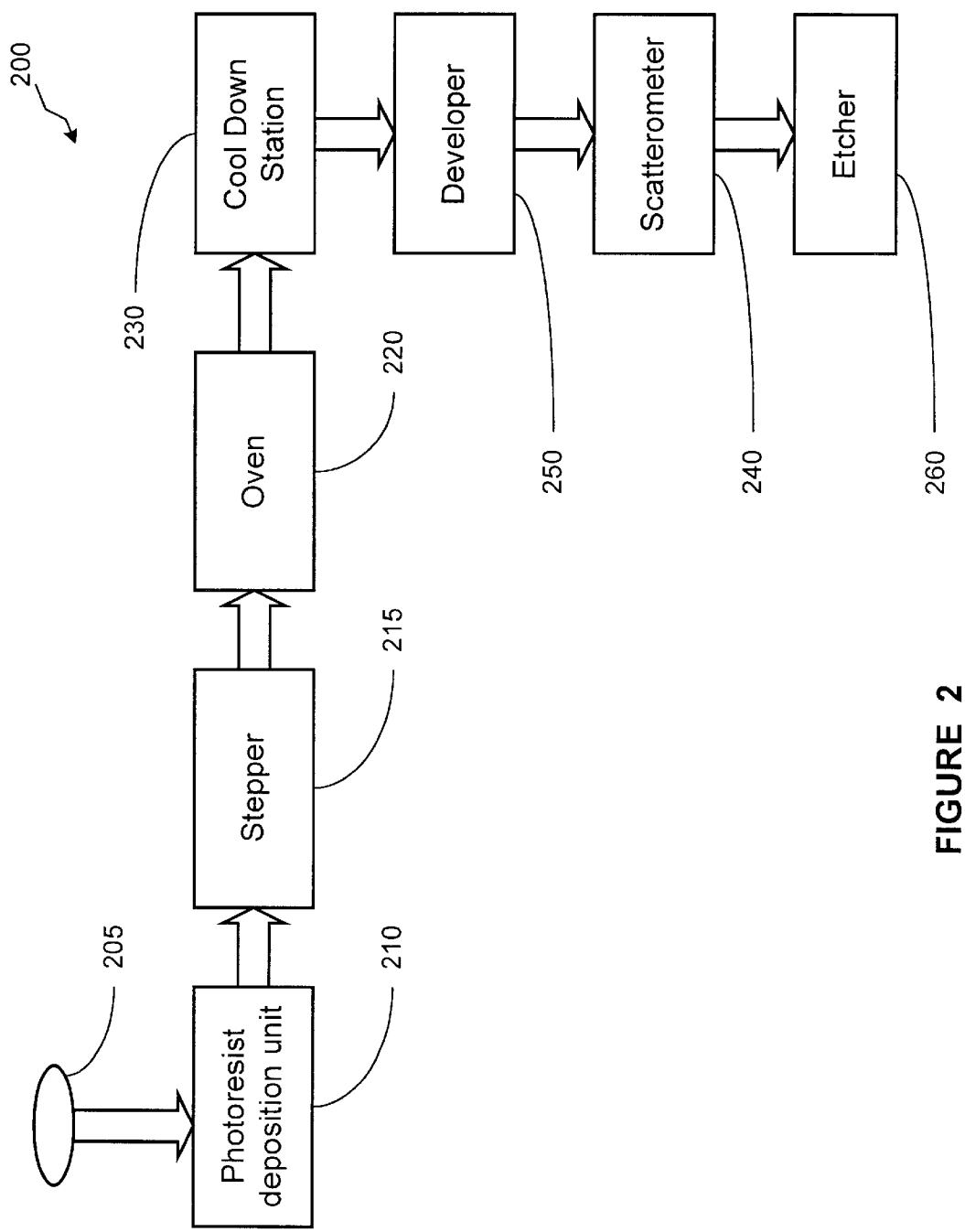
FIG. 2 illustrates a simplified diagram of a processing line for performing photolithography patterning.

Referring now to FIG. 2, a simplified diagram of an illustrative processing line 200 for performing photolithography patterning is depicted. The processing line 200 includes a photoresist deposition unit 210, a stepper 215, an oven 220, a cool down station 230, a developer 250, a scatterometer 240, and an etcher 260. The photoresist deposition unit 210 receives a semiconductor wafer 205, and deposits a predetermined thickness of photoresist material upon the surface of the wafer 205. The stepper 215 then receives the wafer 205 (or lot of semiconductor wafers) and exposes the wafer 205 to a light source using a reticle to pattern the wafer 205. The wafer 205 is transferred to the oven 220, where a post-exposure bake is conducted. Following the post-exposure bake, the wafer 205 is transferred to the cool down station 230, and then to the developer 250 after the wafer 205 has sufficiently cooled. The developer 250 removes exposed photoresist material from the wafer 205.

The wafer 205 is then transferred to the scatterometer 240 for measurements. As described in greater detail below, the scatterometer 240 measures the wafer 205 to determine the acceptability and/or uniformity of the previously performed photolithography processes and conveys wafer measurements to the feedback/feed-forward controller 160. The wafer 205 is then sent to an etcher 260 for etch processing. The computer system 130, which is integrated with the APC framework, based on the wafer measurements, adjusts the recipe of the stepper 215 for subsequent wafers. Also, the measurements can be used by the computer system 130 to adjust the recipe of the etch tool 260 for the measured semiconductor wafer. As will be recognized by those of ordinary skill in the art in light of this disclosure, the processing line 200 may include discrete or integrated processing tools for performing the processing steps described herein. The data acquired by the scatterometer 240 is used for performing feedback and feed-forward modifications of the control input signals on the line 120, which control the processing tools 110, 112.

Figure 3:
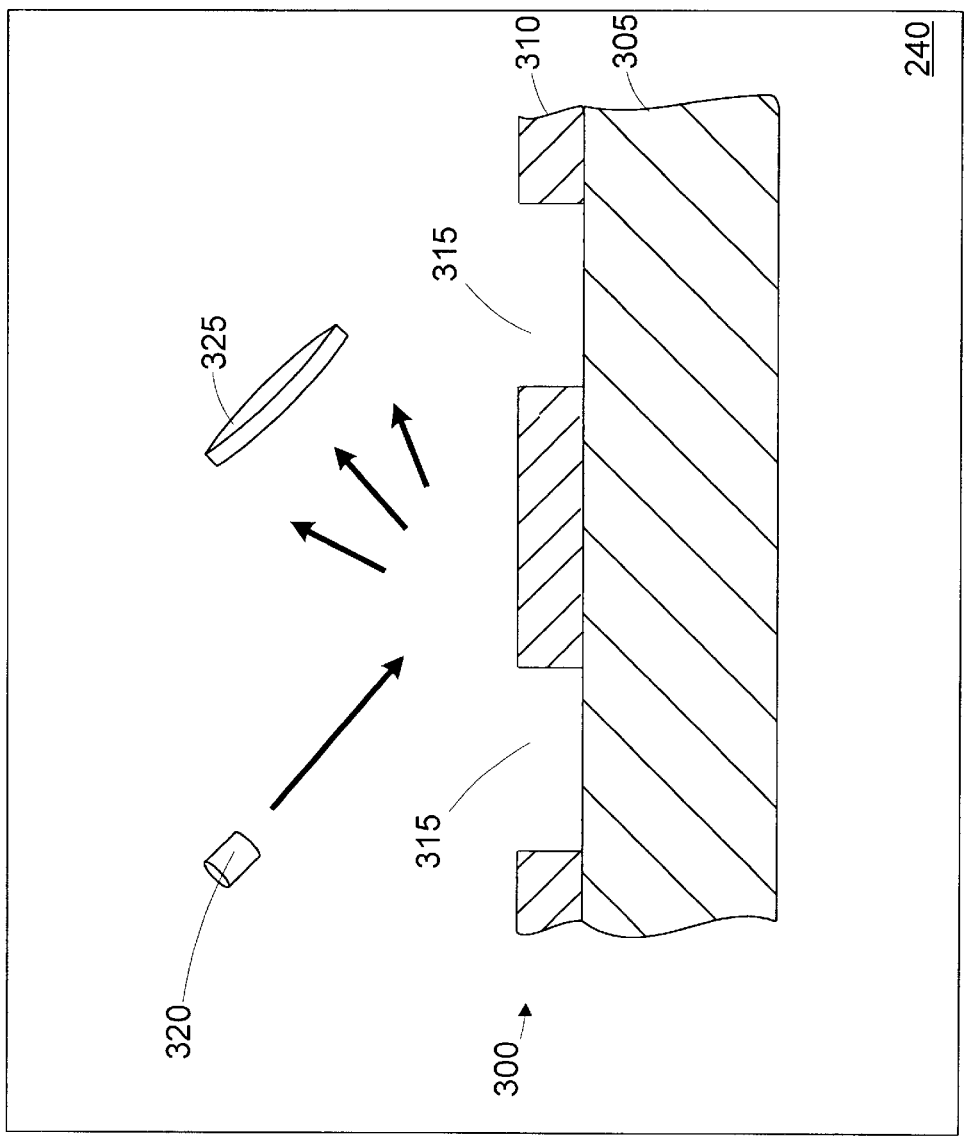
FIG. 3 illustrates a simplified view of the scatterometer with the semiconductor wafer loaded therein.

Referring to FIG. 3, a simplified view of the scatterometer 240 with the wafer 205 loaded therein is provided. The wafer 205 has a base material 305. The photoresist layer 310 has open (or developed) regions 315 formed in the base material 305 resulting from the previous exposure, baking, and development steps (i.e., referred to as a patterned wafer 205). The open regions 315 generally have an index of refraction different than that of the unexposed portions of the photoresist layer 310.

In one embodiment, the scatterometer 240 comprises a light source 320 and a detector 325 positioned proximate the wafer 205. The light source 320 of the scatterometer 240 illuminates at least a portion of the wafer 205, and the detector 325 takes optical measurements, such as intensity, of the reflected light. Although the invention is described using a scatterometer 240 designed to measure reflected light intensity, it is contemplated that other measurement tools, such as an ellipsometer, a reflectometer, a spectrometer, or some other light measuring device, may be used. It is also contemplated that the scatterometer 240 may use monochromatic light, white light, or some other wavelength or combinations of wavelengths, depending on the specific implementation. The angle of incidence of the light may also vary, depending on the specific implementation.

The differences in the refractive indices for the open regions 315 and the unexposed portions of the photoresist layer 310 cause light scattering, resulting in an angle-dependent intensity pattern that relates directly to such pattern properties as line-width, sidewall angle, and resist thickness. The scatterometer 240 measures this intensity pattern at different points on the wafer 205, such as on the periphery and in the middle. A difference in the light intensity pattern between various points indicates a nonconformity, such as a variation in the line-widths of the open regions 315. The light analyzed by the scatterometer 240 typically includes a reflected component and a scattered component. The reflected component corresponds to the light component where the incident angle equals the reflected angle. The scattered component corresponds to the light component where the incident angle does not equal the reflected angle. For purposes of discussion hereinafter, the term "reflected" light is meant to encompass both the reflected component and the scattered component.

The computer system 130, in conjunction with the manufacturing model 140, adjusts the recipe of the stepper 215 to correct the measured nonconformity or deviation from target. For example, if the intensity measurement on the periphery of the wafer 205 is greater than the intensity measurement in the middle, the line-width is presumably less, because a smaller line-width causes less scattering. To correct the line-width variation, the computer system 130 changes the recipe of the stepper 215 such that the exposure sites (e.g., individual die) with smaller line-widths receive either an increased energy exposure or a longer duration exposure.

Detecting variations and adjusting the stepper 215 recipe prior to the wafers leaving the stepper module allows a quicker corrective action response. It is contemplated that all wafers 205 in a lot may be tested, or only selected wafers 205 in the lot. Identifying variations early allows correction of wafers 205 even in the same lot. For more stable steppers 215, the scatterometer 240 may be used only once per shift or once per week, depending on the specific implementation.

Figure 4:
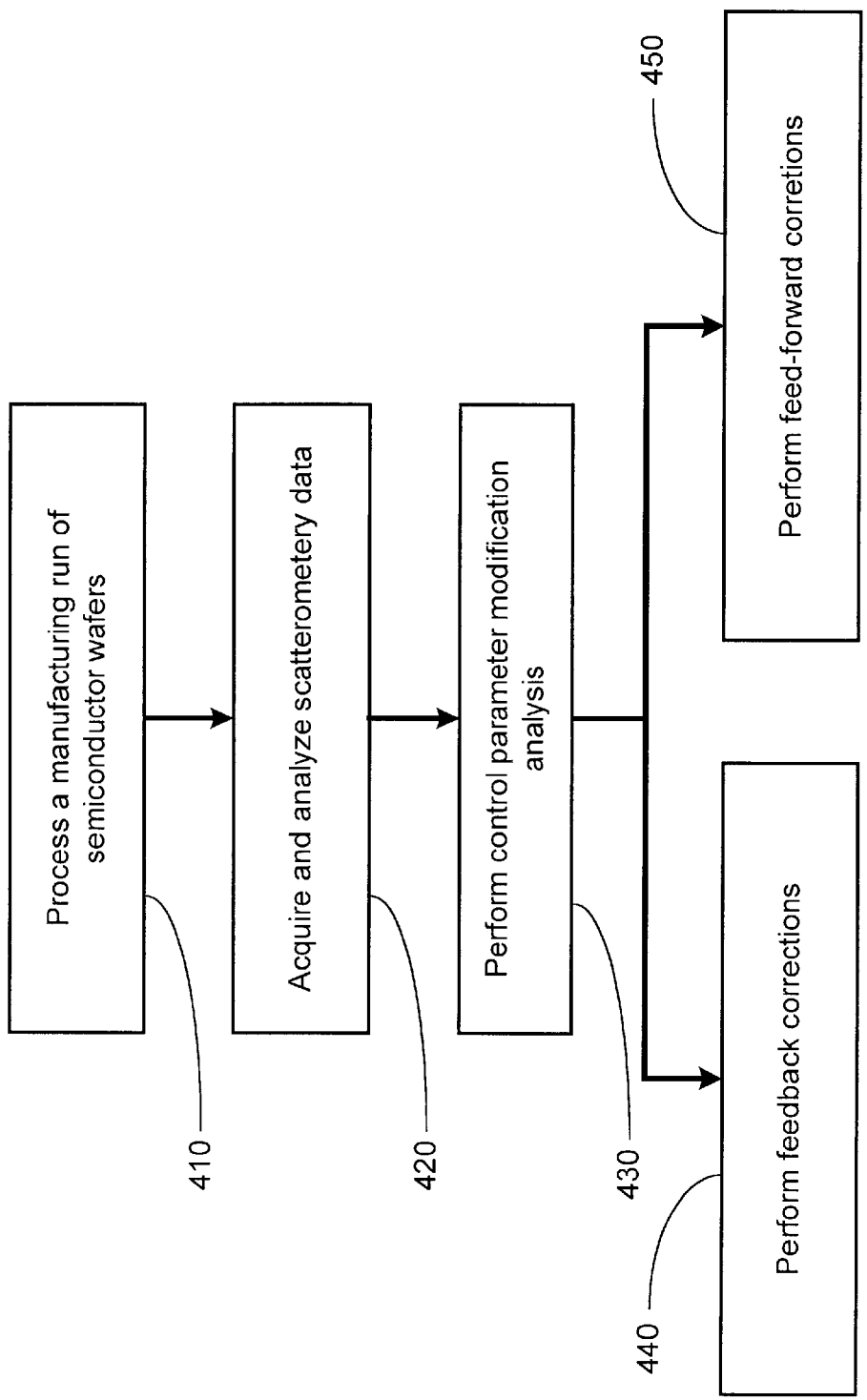
FIG. 4 illustrates a flowchart representation of the methods taught by the present invention.
Figure 5:
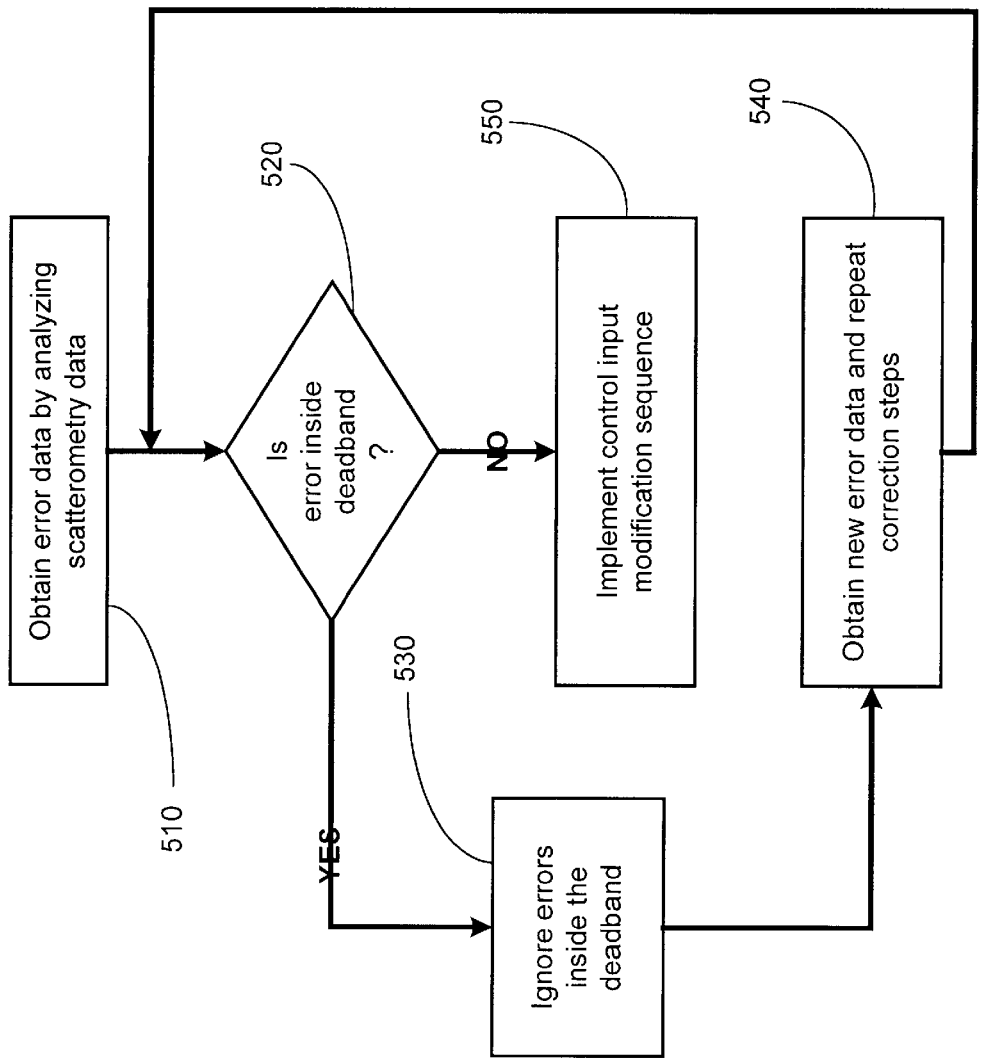
FIG. 5 illustrates, in further detail, one embodiment of the control parameter modification analysis.

Turning now to FIG. 4, a flowchart depiction of one embodiment of the methods taught by the present invention is illustrated. A manufacturing run of semiconductor wafers is processed, as described in block 410 of FIG. 4. The processed semiconductor wafers are sent to a metrology tool 150, such as a scatterometer 240, for acquisition of scatterometry data, as described in block 420 of FIG. 4. The scatterometry data is analyzed by techniques known to those skilled in the art and errors and inconsistencies in the processed semiconductor wafers are quantified. The scatterometry data is used to perform a control parameter modification analysis to determine whether control parameters on the line 120 should be modified, as described in block 430 of FIG. 4. FIG. 5 illustrates one embodiment of the method of performing a control parameter modification analysis on the error data acquired from the scatterometry data analysis.

Turning now to FIG. 5, error data from the scatterometry data related to the processed semiconductor wafers is acquired, as described in block 510. The error data is acquired from one of a plurality of methods known by those skilled in the art. Once the error data is acquired, a determination is made whether the error data is inside the deadband, as described in block 520 of FIG. 5. The step described in block 520 is performed to determine whether an error is sufficiently significant to warrant a change in the control inputs on the line 120. To define the deadband, the errors acquired from product analysis stations (not shown), such as the review station, are compared to a predetermined set of threshold parameters. In one embodiment, the deadband contains a range of error values associated with control input signals centered proximate to a set of corresponding predetermined target values, for which generally controller action is blocked. If any one of the errors acquired from the product analysis station is smaller than its corresponding predetermined threshold value, that particular error is deemed to be in the deadband. One of the primary purposes of the deadband is to prevent excessive control actions, resulting from changes to control input signals on the line 120, from causing a semiconductor manufacturing process to be inordinately jittery.

When a determination is made, as shown in block 520, that an error corresponding to a control input signal is inside the deadband, that particular error is ignored, as described in block 530 of FIG. 5. Therefore, when the value of an error that corresponds to a control input signal is found to be in the predetermined deadband, that particular error is not used to update its corresponding control input signal. In one embodiment, when the error data is determined to be inside the deadband, no changes to the control parameters are made based upon that particular error data. New error data is then obtained and analyzed, as described in block 540 of FIG. 5. In one embodiment, the steps described above are repeated for the new error data that is obtained.

When a determination is made, as shown in block 520, that an error corresponding to a control input signal is not inside the deadband, further processing, such as modifying the control input parameters to compensate for the errors, is performed, as described in block 550 of FIG. 5. The value of the error corresponding to a control input signal is used to update that control input parameter on the line 120 for a subsequent manufacturing process step, which completes the step of performing the control parameter modification analysis, described in block 430 of FIG. 4.

Turning back to FIG. 4, once a determination is made that the control parameters on the line 120 are to modified, feedback modifications are made to reduce the possibility of errors and non-uniformity in subsequent processing of semiconductor wafers, as described in block 440. Generally, the feedback modification of control input signals on the line 120 are performed on photolithography processes, such as line-width adjustments using photo exposure dosages and line profile adjustments using exposure focus modifications. Feedback modification of control input signals on the line 120 can also be performed on etch processes, such as etch line shape adjustments using etch recipe modifications. In one embodiment, the feedback adjustments are made by the computer system 130 and the manufacturing model 140.

When a determination is made that control parameters on the line 120 are to modified, feed-forward modifications are also made to reduce the possibility of errors and non-uniformity in subsequent processing of semiconductor wafers, as described in block 450. Feed-forward modification of control input signals on the line 120 can be used to perform correction of subsequent processes of semiconductor wafers. Feed-forward modification of control input signals on the line 120 can be used for etch or spacer deposition processes, where scatterometry techniques can be used to adjust effective line-widths of precision forms on semiconductor wafers. In one embodiment, in a spacer deposition process, scatterometry measurements can be used to adjust deposition time, which would impact the spacer width, which in turn would impact the effective line-width of a trace on a semiconductor wafer. Furthermore, scatterometry measurements can be used to measure ion implantation parameters and adjust ion implant dosage on subsequent ion implant processes. In one embodiment, the feedback adjustments are made by the computer system 130 and the manufacturing model 140. In addition to implementing the principles taught by the present invention for manufacturing of semiconductor wafers, the principles taught by the present invention can be utilized in other areas of manufacturing.

The principles taught by the present invention can be implemented in an Advanced Process Control (APC) framework. The APC framework is a preferred platform from which to implement the line-width control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the line-width controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a processing run of semiconductor devices;
    acquiring metrology data from said processed semiconductor devices;
    acquiring error data by analyzing said acquired metrology data;
    determining whether said error data merits modification to said processing of semiconductor devices;
    performing a feedback modification of said processing of semiconductor devices in response to said determination that said error data merits modification to said processing of semiconductor devices; and
    performing a feed-forward modification of said processing of said semiconductor devices in response to said determination that said error data merits modification to said processing of semiconductor devices.

2. The method described in claim 1, wherein performing a process run of semiconductor devices further comprises processing semiconductor wafers.

3. The method described in claim 2, wherein processing semiconductor wafers further comprises performing a photolithography process on said semiconductor wafers.

4. The method described in claim 1, wherein acquiring metrology data from said processed semiconductor-devices further comprises acquiring scatterometry data.

5. The method described in claim 1, wherein determining whether said error data merits modification to said processing of semiconductor devices further comprises:
    acquiring error data from said analysis of metrology data;
    determining if said error data is inside a deadband; and
    modifying at least one control input parameter based upon a determination that said error data is not inside said deadband.

6. The method described in claim 1, wherein performing a feedback modification of said processing of semiconductor devices further comprises modifying exposure dosages in a photolithography process.

7. The method described in claim 1, wherein performing a feedback modification of said processing of semiconductor devices further comprises modifying exposure focus in a photolithography process.

8. The method described in claim 1, wherein performing a feedback modification of said processing of semiconductor devices further comprises modifying the etch recipe in an etch process.

9. The method described in claim 1, wherein performing a feedback modification of said processing of semiconductor devices further comprises performing a feedback process upon an Advanced Process Controller (APC).

10. The method described in claim 1, wherein performing a feed-forward modification of said processing of said semiconductor devices further comprises modifying a deposition time period to adjust one of a spacer width and an etch width during one of a spacer deposition process and an etch process.

11. The method described in claim 1, wherein performing a feed-forward modification of said processing of said semiconductor devices further comprises making adjustments to an ion implant dosage during an ion implant process.

12. The method described in claim 1, wherein performing a feed-forward modification of said processing of said semiconductor devices further comprises performing a feed-forward process-upon an Advanced Process Controller (APC).

13. An apparatus, comprising:
    a computer system;
    a manufacturing model coupled with said computer system, said manufacturing model being capable of generating and modifying at least one control input parameter signal;
    a machine interface coupled with said manufacturing model, said machine interface being capable of receiving process recipes from said manufacturing model;
    a processing tool capable of processing semiconductor wafers and coupled with said machine interface, said first processing tool being capable of receiving at least one control input parameter signal from said machine interface;
    a metrology tool coupled with said first processing tool and said second processing tool, said metrology tool being capable of acquiring metrology data;
    a metrology data processing unit coupled with said metrology tool, said metrology data processing unit being capable of organizing said acquired metrology data; and
    a feedback/feed-forward controller coupled with said metrology tool and said computer system, wherein said feedback/feed-forward controller is capable of generating feedback and feed-forward adjustment data and sending them to said computer system for modification of said control system parameters.

14. The apparatus of claim 13, wherein said computer system is capable of generating modification data for modifying at least one control input parameter.

15. The apparatus of claim 13, wherein said manufacturing model is capable of modifying said control input parameter in response to said modification data.

16. The apparatus of claim 13, wherein said metrology tool is a scatterometer.

17. An apparatus, comprising:
    means for performing a processing run of semiconductor devices;
    means for acquiring metrology data from said processed semiconductor devices;
    means for acquiring error data by analyzing said acquired metrology data;
    means for determining whether said error data merits modification to said processing of semiconductor devices;
    means for performing a feedback modification of said processing of semiconductor devices in response to said determination that said error data merits modification to said processing of semiconductor devices; and means for performing a feed-forward modification of said processing of said semiconductor devices in response to said determination that said error data merits modification to said processing of semiconductor devices.

18. A computer readable program storage device encoded with instructions that, when executed by a computer, performs a method, comprising:

performing a processing run of semiconductor devices;

acquiring metrology data from said processed semiconductor devices;

acquiring error data by analyzing said acquired metrology data;

determining whether said error data merits modification to said processing of semiconductor devices;

performing a feedback modification of said processing of semiconductor devices in response to said determination that said error data merits modification to said processing of semiconductor devices; and performing a feed-forward modification of said processing of said semiconductor devices in response to said determination that said error data merits modification to said processing of semiconductor devices.

19. The computer readable program storage device encoded with instructions that, when executed by a computer, performs the method described in claim 18, wherein performing a process run of semiconductor devices further comprises processing semiconductor wafers.

20. The computer readable program storage device encoded with instructions that, when executed by a computer, performs the method described in claim 19, wherein processing semiconductor wafers further comprises performing a photolithography process on said semiconductor wafers.

21. The computer readable program storage device encoded with instructions that, when executed by a computer, performs the method described in claim 18, wherein acquiring metrology data from said processed semiconductor devices further comprises acquiring scatterometry data.

22. The computer readable program storage device encoded with instructions that, when executed by a computer, performs the method described in claim 18, wherein determining whether said error data merits modification to said processing of semiconductor devices further comprises:

acquiring error data from said analysis of metrology data;

determining if said error data is inside a deadband; and modifying at least one control input parameter based upon a determination that said error data is not inside said deadband.

23. The method described in claim 18, wherein performing a feedback modification of said processing of semiconductor devices further comprises modifying exposure dosages in a photolithography process.

24. The computer readable program storage device encoded with instructions that, when executed by a computer, performs the method described in claim 18, wherein performing a feedback modification of said processing of semiconductor devices further comprises modifying exposure focus in a photolithography process.

25. The computer readable program storage device encoded with instructions that, when executed by a computer, performs the method described in claim 18, wherein performing a feedback modification of said processing of semiconductor devices further comprises modifying the etch recipe in an etch process.

26. The computer readable program storage device encoded with instructions that, when executed by a computer, performs the method described in claim 18, wherein performing a feedback modification of said processing of semiconductor devices further comprises performing a feedback process upon an Advanced Process Controller (APC).

27. The computer readable program storage device encoded with instructions that, when executed by a computer, performs the method described in claim 18, wherein performing a feed-forward modification of said processing of said semiconductor devices further comprises modifying a deposition time period to adjust one of a spacer width and an etch width during one of a spacer deposition process and an etch process.

28. The computer readable program storage device encoded with instructions that, when executed by a computer, performs the method described in claim 18, wherein performing a feed-forward modification of said processing of said semiconductor devices further comprises making adjustments to an ion implant dosage during an ion implant process.

29. The computer readable program storage device encoded with instructions that, when executed by a computer, performs the method described in claim 18, wherein performing a feed-forward modification of said processing of said semiconductor devices further comprises performing a feed-forward process upon an Advanced Process Controller (APC).

* * * * *

UNITED STATES PATENT AND TRADEMARK OFFICE
CERTIFICATE OF CORRECTION

PATENT NO. : 6,643,557 B1
DATED : November 4, 2003
INVENTOR(S) : Michael L. Miller and Anthony J. Toprac It is certified that error appears in the above-identified patent and that said Letters Patent is hereby corrected as shown below:

<u>Column 9,</u>
Line 13, replace "semiconductor-devices" with -- semiconductor devices --.

<u>Column 10,</u>
Line 16, replace "process-upon" with -- process upon --.

Signed and Sealed this

Twenty-fourth Day of February, 2004

JON W. DUDAS
*Acting Director of the United States Patent and Trademark Office*